(12) United States Patent
Callaghan

(10) Patent No.: US 12,124,706 B2
(45) Date of Patent: Oct. 22, 2024

(54) APPARATUS WITH SIGNAL QUALITY FEEDBACK

(71) Applicant: Micron Technology, Inc., Boise, ID (US)

(72) Inventor: Jackson Callaghan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 41 days.

(21) Appl. No.: 17/897,153

(22) Filed: Aug. 27, 2022

(65) Prior Publication Data

US 2024/0069744 A1    Feb. 29, 2024

(51) Int. Cl.
*H04L 65/70*   (2022.01)
*G06F 3/06*   (2006.01)
*H04L 7/00*   (2006.01)
*H04L 25/06*   (2006.01)

(52) U.S. Cl.
CPC .......... *G06F 3/0619* (2013.01); *G06F 3/0653* (2013.01); *G06F 3/0673* (2013.01); *H04L 7/0037* (2013.01); *H04L 25/063* (2013.01)

(58) Field of Classification Search
CPC ............. G06F 13/1689; G06F 13/4243; G06F 12/0246; G06F 3/061; G06F 1/10; G06F 12/00; G06F 13/1615; G06F 13/1694; H04L 7/0008; H04L 7/033; H04L 25/05; H04L 67/10; H04L 7/0025; H04L 7/0079; H04L 7/0091; H04L 2209/80; H04L 25/0202; H04W 36/30; H04W 24/08; H04W 36/14; H04W 48/18; H04W 84/12; H04W 12/041; H04W 12/50; H04W 12/65; H04W 36/08
USPC ......................................................... 375/317
See application file for complete search history.

(56) References Cited

U.S. PATENT DOCUMENTS

| | | | |
|---|---|---|---|
| 9,515,856 B2 * | 12/2016 | Kaviani | H04L 25/03063 |
| 2004/0076192 A1 * | 4/2004 | Zerbe | G06F 13/364 |
| | | | 370/252 |
| 2016/0077903 A1 * | 3/2016 | Reddy | G06F 11/0727 |
| | | | 714/704 |
| 2020/0349996 A1 * | 11/2020 | Giovannini | G11C 7/1078 |
| 2022/0300197 A1 * | 9/2022 | Sethuraman | G06F 3/0673 |

* cited by examiner

*Primary Examiner* — Eva Y Puente
(74) *Attorney, Agent, or Firm* — Perkins Coie LLP

(57) ABSTRACT

Methods, apparatuses, and systems related to operations for measuring the quality of a signal received by a memory device and providing feedback. The memory device can sample signal data using a predetermined sequence of timing offsets relative to a reference signal. Additionally or alternatively, the memory device can sample the signal data using a predetermined sequence of reference voltages. The memory device can provide feedback results to a controller regarding the quality of the sampled signal data.

20 Claims, 7 Drawing Sheets

APPARATUS WITH SIGNAL QUALITY FEEDBACK

TECHNICAL FIELD

The disclosed embodiments relate to devices, and, in particular, to semiconductor memory devices with signal quality feedback.

BACKGROUND

An apparatus (e.g., a data processing device, a memory device, a memory system, or a combination thereof) can include one or more semiconductor circuits configured to store and/or process information. For example, the apparatus can include a memory device, such as a volatile memory device, a non-volatile memory device, or a combination device. Memory devices, such as Flash memory and dynamic random-access memory (DRAM), can utilize electrical energy to store and access data.

With technological advancements in various areas and increasing applications, the market is continuously looking for faster, more efficient, and smaller devices. To meet the market demand, the semiconductor devices are being pushed to the limit. However, attempts to increase the operating speed and/or to decrease the circuit size often create other issues, such as degraded signal qualities, increased noise, and increased processing errors. In view of the ever-increasing commercial competitive pressures, along with growing consumer expectations and the desire to differentiate products in the marketplace, it is increasingly desirable that answers be found to these problems. Additionally, the semiconductor devices must protect signal integrity of transmission lines, receivers, and drivers, as poor signal quality can lead to system instability and data loss. Moreover, the need to reduce costs, improve efficiencies and performance, and meet competitive pressures adds an even greater pressure to find answers to these problems.

DETAILED DESCRIPTION

Figure 1A:
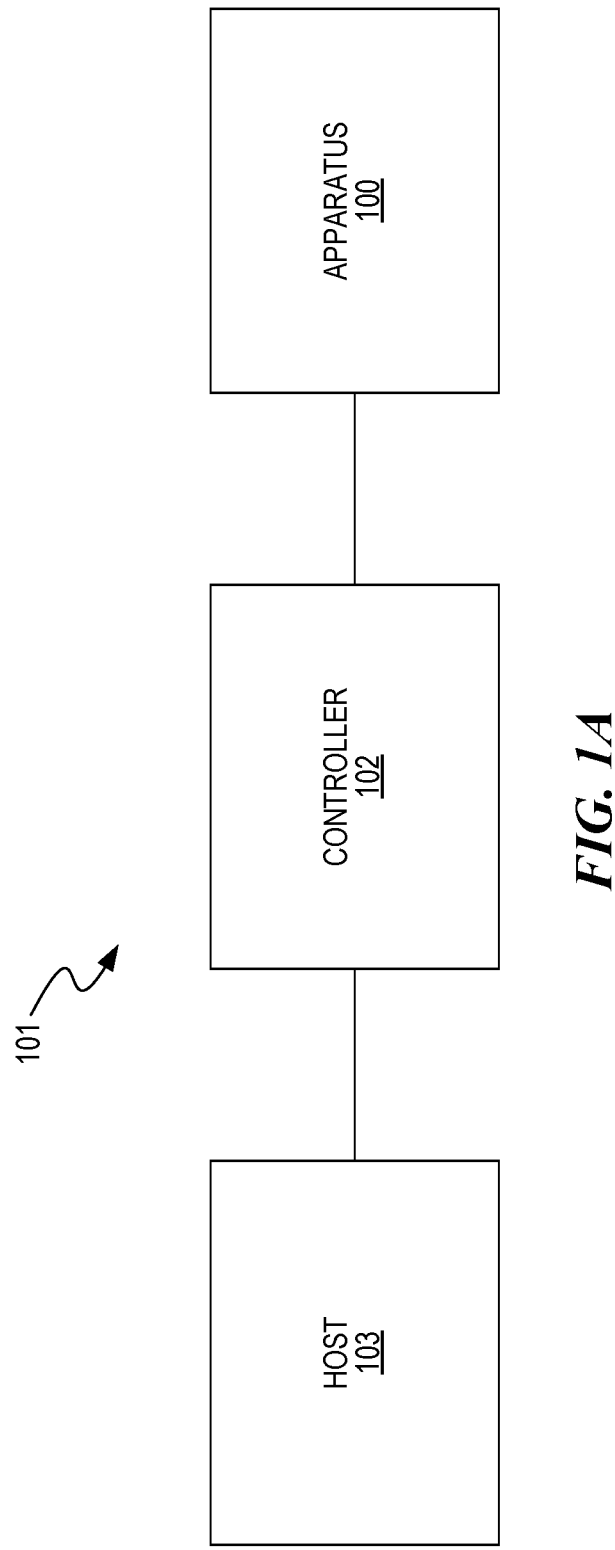
FIG. 1A is a block diagram of an example environment in which an apparatus may operate in accordance with an embodiment of the present technology.

As described in greater detail below, the technology disclosed herein relates to an apparatus, such as a memory system, a system with one or more memory devices, a related method, etc., for managing memory-internal operations. In some embodiments, the apparatus may be configured to measure the quality of a signal received by a memory device and providing feedback to an external device. The apparatus (e.g., a memory system/device, such as a DRAM) can receive a signal data, such as a data pattern, from the apparatus controller. The apparatus can sample the received signal data at different times relative to the signal data respective data strobe or clock. For example, the apparatus uses a delay-locked loop to adjust the sampling time relative to the clock or strobe signal. Accordingly, the apparatus can sample a known data pattern while effectively sweeping the sample time from an "early" position to a "late" position. Additionally, the apparatus can also sample the received signal data at different reference voltages set at the receivers of the apparatus. For example, the apparatus can adjust the internal reference voltage higher and/or lower than the nominal voltage level for each sample timing.

The apparatus can test the integrity of the signal by comparing the sampled signal data to an expected signal measurement (e.g., reference setting, predetermined/standard/known data pattern for the apparatus, etc.). For example, the apparatus compares the sampled signal data to the expected data to determine an effective range of sampling times that provide accurate results. Using sample time offsets relative to the strobe as a horizontal aspect and the reference voltage setting as a vertical aspect, the apparatus can use each signal point to create a plot. For example, the memory die can effectively generate an on-die Shmoo plot that can be provided to the apparatus controller as a feedback or an indication of the signal quality. The plot can illustrate the combinations of sample timing and reference voltage that have correct data. The apparatus can send the sampled signal data results to the apparatus controller. The determined sampled signal data can be used (via, e.g., the memory, the controller, the processor, or a combination thereof) to adjust the communication settings according to the signal quality and/or any corresponding conditions (e.g., real-time parameters, such as process, voltage, temperature (PVT) parameters).

By sampling received signals at different times and at various voltages, the apparatus can measure the operating conditions and the corresponding signal margin without or instead of the use of an oscilloscope. Accordingly, the apparatus can further eliminate the use of interposers that are conventionally introduced to provide an interface between the oscilloscope and pins of a memory device. By eliminating the interposer, the apparatus can eliminate any corresponding stubs and loading that introduce differences between the measured signal and the actually-received signal.

As described in detail below, embodiments of the present technology can provide technical advantages over conventional technology and include circuits/functions to 1) measure the signal integrity margin at the receivers of a memory device; 2) allow a memory device to measure the signal integrity margin without the use of an oscilloscope; 3) save time and resources that would be spent on conventional methods to measure signal integrity margin, by eliminating the need for an oscilloscope and solder network involved in inserting interposers in a system at test points; 4) provide a representation of the signal eye at the receiver of the memory device since conventional methods, such as oscilloscopes, are unable to provide an accurate representation, due to features, such as decision feedback equalization; 5) allow memory devices to reach market at a faster rate due to the time saved on debugging and validation services; and 6) create a robust system across the apparatus controller and memory device.

For illustrative purposes, embodiments of the present technology are described using signals exchanged between the controller and the DRAM memory. However, it is understood that the present technology can be implemented differently. For example, the signal quality check/feedback described below can be implemented for different circuit combinations, such as between processors or between separately housed/encased circuits. Also for example, the signal quality check/feedback described below can be implemented for other types of signals, such as clock signals, enable/timing signals, etc. Moreover, the present technology can be implemented for other types of memory, such as non-volatile memories or other types of volatile memories.

FIG. 1A is a block diagram of an example environment 101 in which an apparatus 100 may operate in accordance with an embodiment of the present technology. The example environment 101 can correspond to a computing device or system. As described in detail below, the apparatus 100 can include a memory device or system, such as a volatile memory, a non-volatile memory, or a combination device/system. For example, the apparatus 100 can include a DRAM.

The apparatus 100 can be electrically coupled to an apparatus controller 102 (e.g., a memory controller, a buffer, a repeater device, such as an RCD, etc.) and a host 103 (e.g., one or more processors). Some example operating environments can include a computing system having a central processing unit (CPU) as the host 103 interacting with an apparatus controller to write data to and read data from a DRAM (the apparatus 100). The host 103 can function according to an operating system and send operational communications (e.g., read/write commands, write data, addresses, etc.) to the apparatus controller. The apparatus 100 can also send read data back to the apparatus controller 102 as the operational communications. The apparatus controller 102 can manage the flow of the data to or from the apparatus 100 according to the address and/or the operation.

Figure 1B:
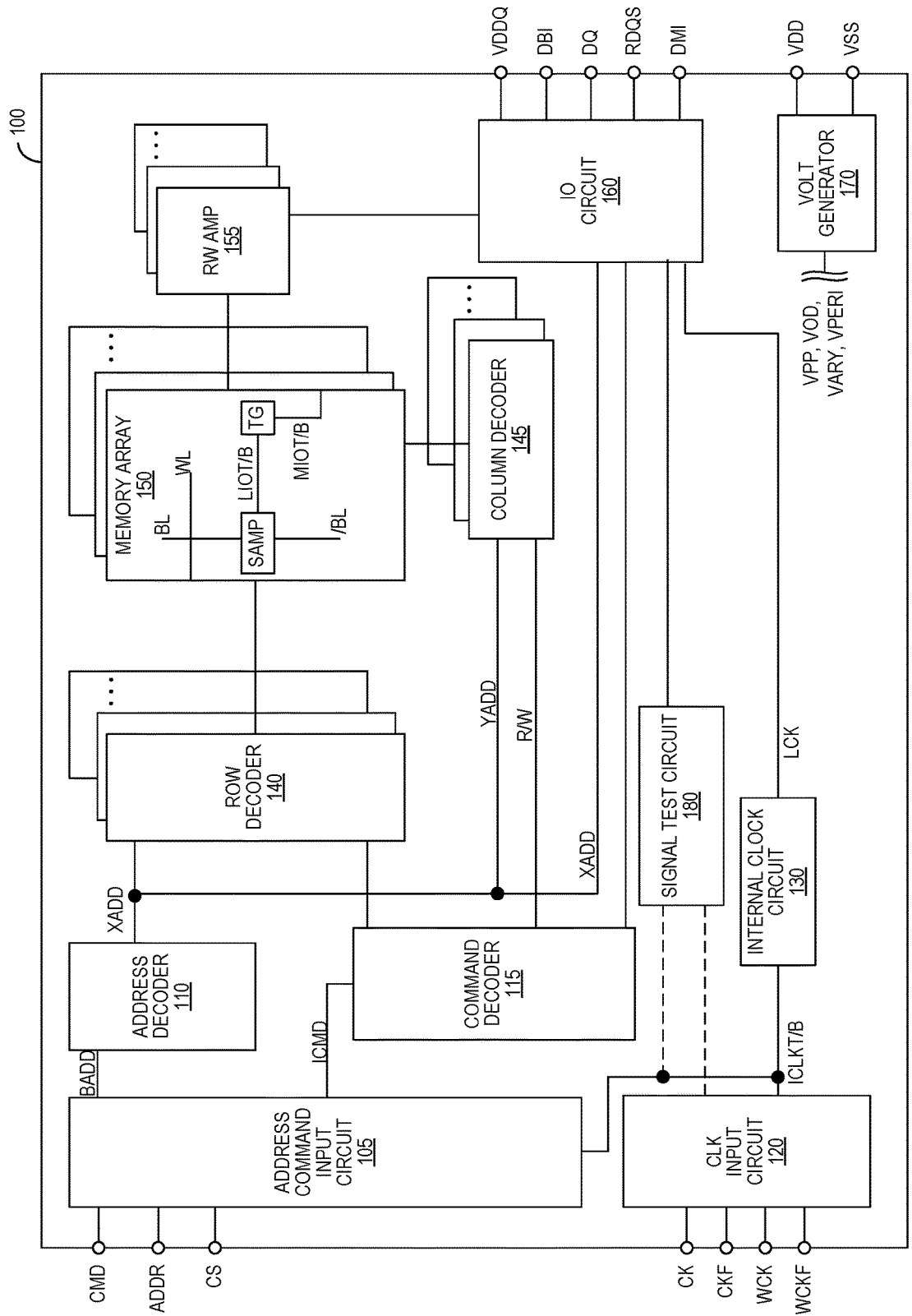
FIG. 1B is a block diagram of an apparatus in accordance with an embodiment of the present technology.

FIG. 1B is a block diagram of the apparatus 100 (e.g., a semiconductor die assembly, including a 3DI device or a die-stacked package) in accordance with an embodiment of the present technology. For example, the apparatus 100 can include a DRAM (e.g., Double Data Rate (DDR) DRAM, such as DDR4 or DDR5 DRAM, LP DRAM, HBM DRAM, etc.), or a portion thereof.

The apparatus 100 may include an array of memory cells, such as memory array 150. The memory array 150 may include a plurality of banks (e.g., banks 0-15), and each bank may include a plurality of word lines WL, a plurality of bit lines BL, and a plurality of memory cells arranged at intersections of the word lines and the bit lines. Memory cells can include any one of a number of different memory media types, including capacitive, magnetoresistive, ferroelectric, phase change, or the like. The selection of a word line (WL) may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The apparatus 100 may employ a plurality of external terminals that include command and address terminals coupled to a command bus and an address bus to receive command signals (CMD) and address signals (ADDR), respectively. The apparatus 100 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 1B) from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal and supply the bank address signal to both the row decoder 140 and the column decoder 145.

Figure 2:
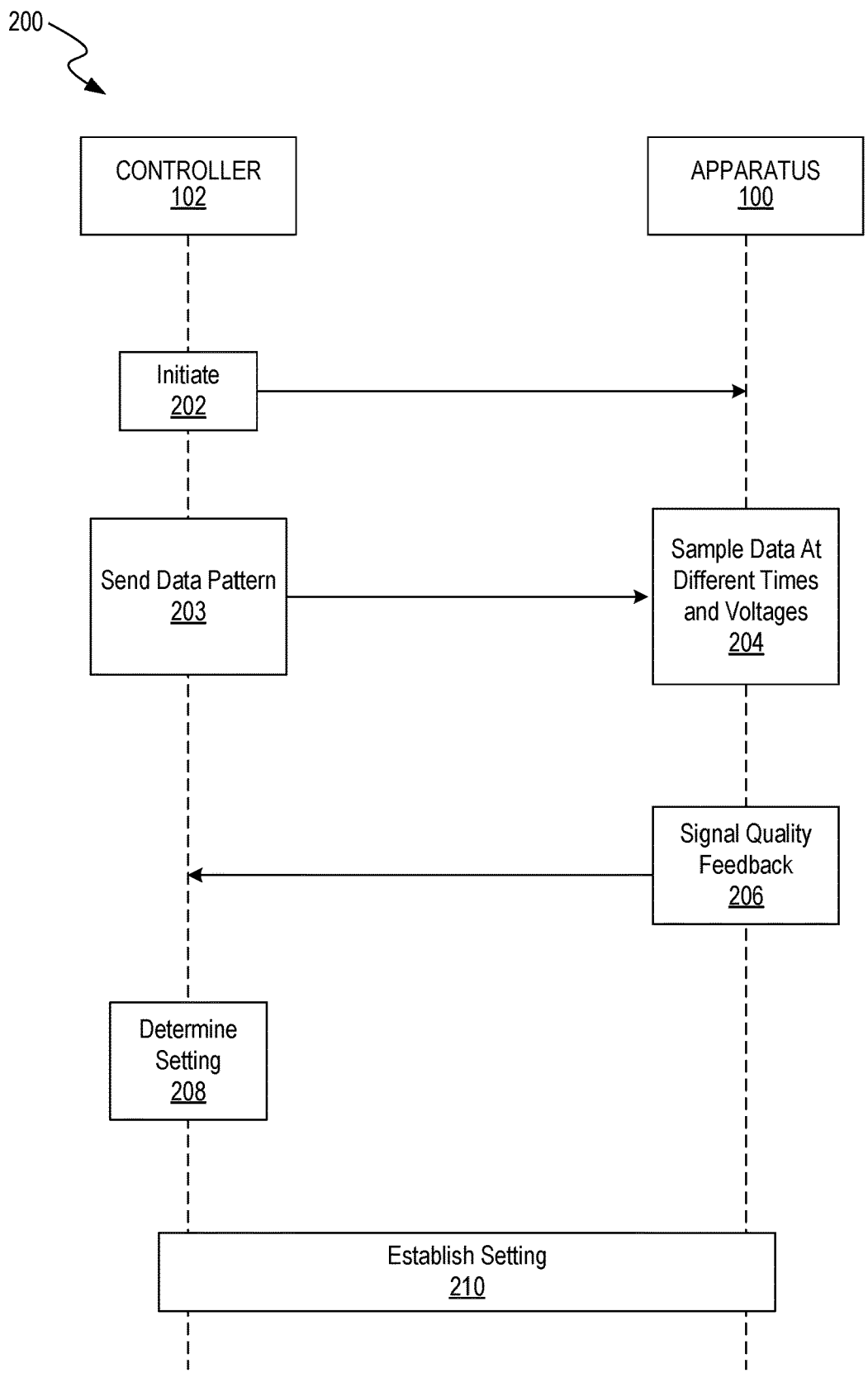
FIG. 2 is a flow diagram illustrating an example method of operating devices for a signal quality check and feedback in accordance with an embodiment of the present technology.

The command and address terminals may be supplied with command signals (CMD), address signals (ADDR), and chip select signals (CS), from a memory controller (e.g., the apparatus controller 102 of FIG. 1A or 2). The command signals may represent various memory commands from the memory controller (e.g., including access commands, which can include read commands and write commands). The chip select signal may be used to select the apparatus 100 to respond to commands and addresses provided to the command and address terminals. When an active chip select signal is provided to the apparatus 100, the commands and addresses can be decoded and memory operations can be performed. The command signals may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The command decoder 115 may further include one or more registers for tracking various counts or values (e.g., counts of refresh commands received by the apparatus 100 or self-refresh operations performed by the apparatus 100).

Read data can be read from memory cells in the memory array 150 designated by row address (e.g., address provided with an active command) and column address (e.g., address provided with the read). The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the apparatus 100, for example, in a mode register (not shown in FIG. 1B). The read latency information RL can be defined in terms of clock cycles of the CK clock signal. For example, the read latency information RL can be a number of clock cycles of the CK signal after the read command is received by the apparatus 100 when the associated read data is provided.

Write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the apparatus 100, for example, in the mode register (not shown in FIG. 1B). The write latency WL information can be defined in terms of clock cycles of the CK clock signal. For example, the write latency information WL can be a number of clock cycles of the CK signal after the write command is received by the apparatus 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a clock/enable signal from the command decoder 115, an input buffer can receive the clock/enable signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable (not shown in FIG. 1B) from the command/address input circuit 105. For example, the internal clock circuit 130 can include a clock path (not shown in FIG. 1B) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the apparatus 100 at different data rates. A higher clock frequency may be desirable when high memory speed is desired. A lower clock frequency may be desirable when lower power consumption is desired. The internal clock signals ICLK can also be supplied to a timing generator and thus various internal clock signals can be generated.

The apparatus 100 can be connected to any one of a number of electronic devices capable of utilizing memory for the temporary or persistent storage of information, or a component thereof. For example, the host device and the apparatus 100 may be included in a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.).

The apparatus 100 can include a signal test circuit 180. The signal test circuit 180 can be included in or coupled to circuits receiving signals from an external source. For example, the signal test circuit 180 can be included in or coupled to the command/address input circuit 105, the clock input circuit 120, and/or the IO circuit 160. The signal test circuit 180 can be configured to control the sampling of one or more signals received from an external source, such as the apparatus controller 102 of FIG. 1A. The signal test circuit 180 can cause the received signal to be sampled at different times relative to the clock input from the clock input circuit 120 and/or the strobe (e.g., the RDQS) received at the IO circuit 160. Additionally, the signal test circuit 180 can sample the received signals at different reference voltages. In some embodiments, the signal test circuit 180 can control the sampling timing for the input/output circuit 160.

Figure 1C:
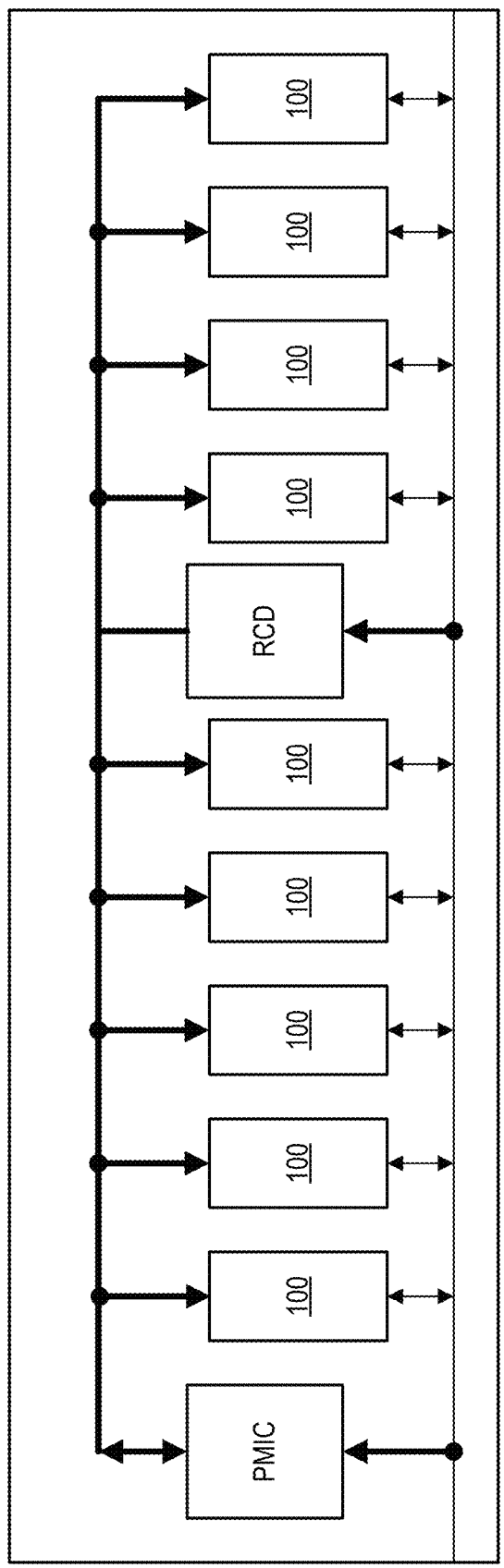
FIG. 1C is a block diagram of a further example environment in which an apparatus may operate in accordance with an embodiment of the present technology.

FIG. 1C is a block diagram of a further example environment in which an apparatus may operate in accordance with an embodiment of the present technology. FIG. 1C schematically illustrates a memory module (e.g., a dual in-line memory module (DIMM) that includes a plurality of DRAM (e.g., the apparatus 100). The memory module can include an edge connector along an edge of a substrate (e.g., a printed circuit board (PCB) or the like) for connecting one or more communication buses (illustrated in bold lines) to a host device. The buses can include (1) a data bus that conveys data signals during memory access operations (e.g., reads and writes) and/or (2) a service bus that conveys information associated with the data communicated over the data bus. For example, the service bus can include a command bus and/or an address bus.

The memory module can further include control circuitry, such as a registering clock driver (RCD). The RCD can include circuitry configured to receive command/address signals from the service bus and generate memory command/address signals for the DRAM.

The DIMM can further include a power management circuitry, such as a power management integrated circuit (PMIC). For example, DDR5 DIMM can include the PMIC that receives external power (e.g., 12V) and distributes internal voltage (e.g., 1.1V VDD supply).

In some embodiments, the apparatus 100, the RCD, the host 103 of FIG. 1A, the apparatus controller 102 of FIG. 1A, or a combination thereof can include circuitry configured to adjust or tune communication circuits to accommodate communication conditions (e.g., real-time conditions). For example, the address-command input circuit 105 of FIG. 1B, the clock input circuit 120 of FIG. 1B, the IO circuit 160 of FIG. 1B, or a combination thereof on each of the apparatus 100 can include analog and/or digital circuitry (e.g., the signal test circuit 180 of FIG. 1B) configured to sample the received signal, implement a signal quality test, and provide corresponding feedback and/or adjustments to external transmitting circuit (e.g., the apparatus controller 102). The corresponding circuitry may include logic and/or firmware configured to implement the signal measurement and test and output the results via an output communication path (e.g., DQ output path) to the apparatus controller 102. Also, the host 103, the apparatus controller 102, and/or the RCD can include circuitry configured to complement and interact with the signal test circuit 180 to establish system-wide communication settings, such as between the apparatus 100, the apparatus controller 102, the host 103, the RCD, or a combination thereof. Details regarding the signal test circuit 180 are described below.

FIG. 2 is a flow diagram illustrating an example method 200 of operating devices (e.g., devices illustrated in FIGS. 1A, 1B, and/or 1C) for a signal quality check and feedback in accordance with an embodiment of the present technology. The example method 200 can correspond to operations of a computing device or system, such as including the apparatus 100 (e.g., a DRAM) that is electrically coupled to the apparatus controller 102 (e.g., a memory controller, a buffer, a repeater device, such as an RCD, etc.). The apparatus controller 102 and the apparatus 100 can interact with each other in real-time, such as during system initialization and/or actual use by an end-user, to sample signal data and provide feedback. The apparatus controller 102 and the apparatus 100 can use the interactions to measure, communicate, and assess one or more actual traits or qualities (e.g., as perceived by a receiving circuit) in real-time. The apparatus controller 102 and the apparatus 100 can use the resulting assessments to adjust the one or more exchanged signals, thereby enhancing throughput/operating speeds and/or reducing errors for the apparatus controller 102 and the DRAM.

At block 202, the apparatus controller 102 can initiate the signal quality check at the receivers, such as by issuing a corresponding operation command. The apparatus controller 102 can be configured to initiate the signal quality check during real-time operation of the corresponding system/environment. For example, the apparatus controller 102 can be configured to initiate the signal quality check upon system power-up or the corresponding system initialization. Additionally or alternatively, the apparatus controller 102 can initiate based on a signal (e.g., a dedicated request, an error measure, or the like) from the DRAM.

At block 204, the apparatus 100 can enter the signal quality check mode, such as by activating the signal test circuit 180 of FIG. 1B, in response to the initiating command from the apparatus controller 102. While the apparatus 100 is in the signal quality check mode, the apparatus controller 102 can provide a predetermined sequence of signals/data as illustrated at block 203. Accordingly, the apparatus 100 can use the signal test circuit 180 to sample the predetermined sequence of signals/data. For example, the apparatus 100 can sample the incoming signals using a predetermined set/sequence of timing offsets relative to a reference signal (e.g., a clock/strobe signal, such as the RDQS). Additionally or alternatively, the apparatus 100 can sample the incoming signals using a predetermined set/sequence of reference voltages. The apparatus 100 can store the corresponding sampling results.

At block 206, the apparatus 100 can provide feedback results, such as the sampling results, to the apparatus controller 102 regarding the quality of the sampled signal data. The apparatus controller 102 and the apparatus 100 can be configured to communicate the feedback results using one or more connections that are used for other communications for other or run-time operating modes. For example, the apparatus 100 can use the DQ bus and the corresponding circuitry to send pass/fail data for each voltage and/or timing. In some embodiments, the apparatus 100 can sequentially send the signal test data according to a predetermined format that corresponds to a different (e.g., two-dimensional) representation. For example, the apparatus 100 can send the test results that corresponds to a shmoo plot that displays the pass/fail results corresponding values of the sampling timing offset and/or the reference voltage.

At block 208, the apparatus controller 102 can determine a communication circuit setting in response to the signal quality feedback. For example, the apparatus controller 102 can determine a setting, or a combination thereof according to the signal quality feedback.

At block 210, the apparatus controller 102, the apparatus 100, or a combination thereof can establish the determined communication circuit setting across the communicating circuits. For example, the communicating circuits can communicate and implement the determined settings, or the like for improving the system operating speed, the error rate, or other performance measures. Additionally or alternatively, the apparatus 100 can ensure that the sample timing is within the passing ranges and/or that the reference voltage is within the passing ranges.

Figure 3:
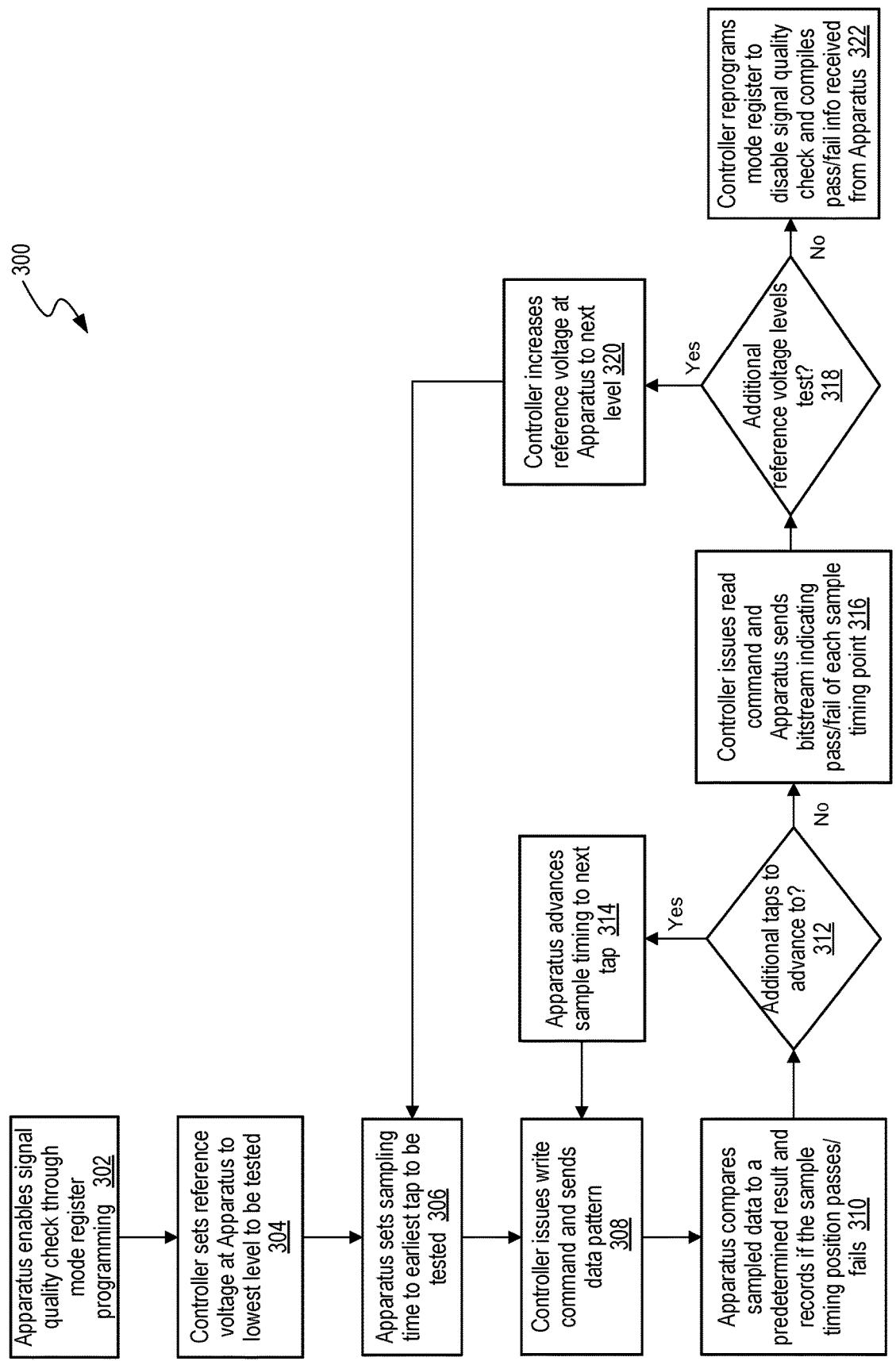
FIG. 3 is a flow diagram illustrating an example method of operating an apparatus for a signal quality check and feedback in accordance with an embodiment of the present technology.

FIG. 3 is a flow diagram illustrating an example method 300 of operating an apparatus (e.g., the apparatus 100 of FIG. 1A, such as using the address command input circuit 105 of FIG. 1B, the clock input circuit 120 of FIG. 1B, the signal test circuit 180 of FIG. 1B, and/or the I/O circuit 160 of FIG. 1B) for the signal quality check and feedback in accordance with an embodiment of the present technology.

In some embodiments, the method 300 can be for determining the quality/integrity of a signal, such as the data signal, received by the apparatus (e.g., a memory device, such as a DRAM, Flash device, and the like) from an apparatus controller (e.g., apparatus controller 102 of FIG. 1A) and providing a feedback, such as in real-time. The method 300 can correspond to blocks 202, 203, 204, and 206 of FIG. 2, and/or other related processes described above.

At block 302, the apparatus enables a signal quality check through mode register programming. The apparatus can enable the signal quality check based on a command received from the apparatus controller or a predetermined condition(s). At block 304, the apparatus controller sets the reference voltage at the apparatus to the lowest level, in relation to the nominal voltage, to be tested.

At block 306, the apparatus sets the sampling time to the earliest tap to be tested. Each tap can correspond to a timing offset relative to a reference clock signal. At block 308, the apparatus controller issues a write command and sends a data pattern to the apparatus. The apparatus can sample the data pattern according to the sampling time of the earliest tap and at the lowest reference voltage level. At block 310, the apparatus compares the sampled data to a predetermined result (e.g., reference setting, predetermined/standard/known data pattern for the apparatus, etc.) to determine if the sampled data matches the predetermined result. The apparatus can record if the sampled data at the measured timing and voltage position passes/fails the comparison by matching or not matching the predetermined result.

At block 312, the apparatus determines whether there are additional taps to advance to for other time offset values. If there are additional taps to test, at block 314, the apparatus advances the sample timing to the next tap and receives a write command from the apparatus controller with a data pattern (at block 308) to measure. The apparatus can compare the sampled data measured at the the additional taps to predetermined results and record if the sampled data at the measured timing and voltage position passes/fails the comparison. If there are no additional taps to test, at block 316, the apparatus controller issues a read command, and the apparatus sends a bitstream indicating the pass/fail records of each sample timing point.

At block 318, the apparatus determines whether there are additional reference voltage levels to test. If there are additional reference voltage levels to test, at block 320, the apparatus controller increases the reference voltage at the apparatus to the next voltage level. For example, the apparatus controller increases the reference voltage to a voltage level greater than the lowest voltage level at block 304. The apparatus can set the sampling time to the earliest tap to be tested for the next voltage level and the operations of blocks 306-316 are repeated until all the reference voltage levels have been tested. For example, for each timing point, the sample data is measured at the timing offset values for all the taps and the reference voltage levels for that data sample is adjusted up and down.

If there are no additional reference voltage levels to test, at block 322, the apparatus controller reprograms the mode register of the apparatus to disable the signal quality check. The apparatus controller can compile the pass/fail records corresponding to the values of the sampling timing offsets and/or the reference voltages levels received from the apparatus. For example, the apparatus controller can read out the pass/fail records for each point from the apparatus through an operation such as a mode register read.

For illustrative purposes, method 300 is described starting with a lowest reference voltage level and the earliest tap of sample timing. However, it is understood that method 300 can be implemented differently. For example, the apparatus controller can select any reference voltage level and/or the apparatus can set the sample timing to any tap to begin the signal quality check process.

Figure 4:
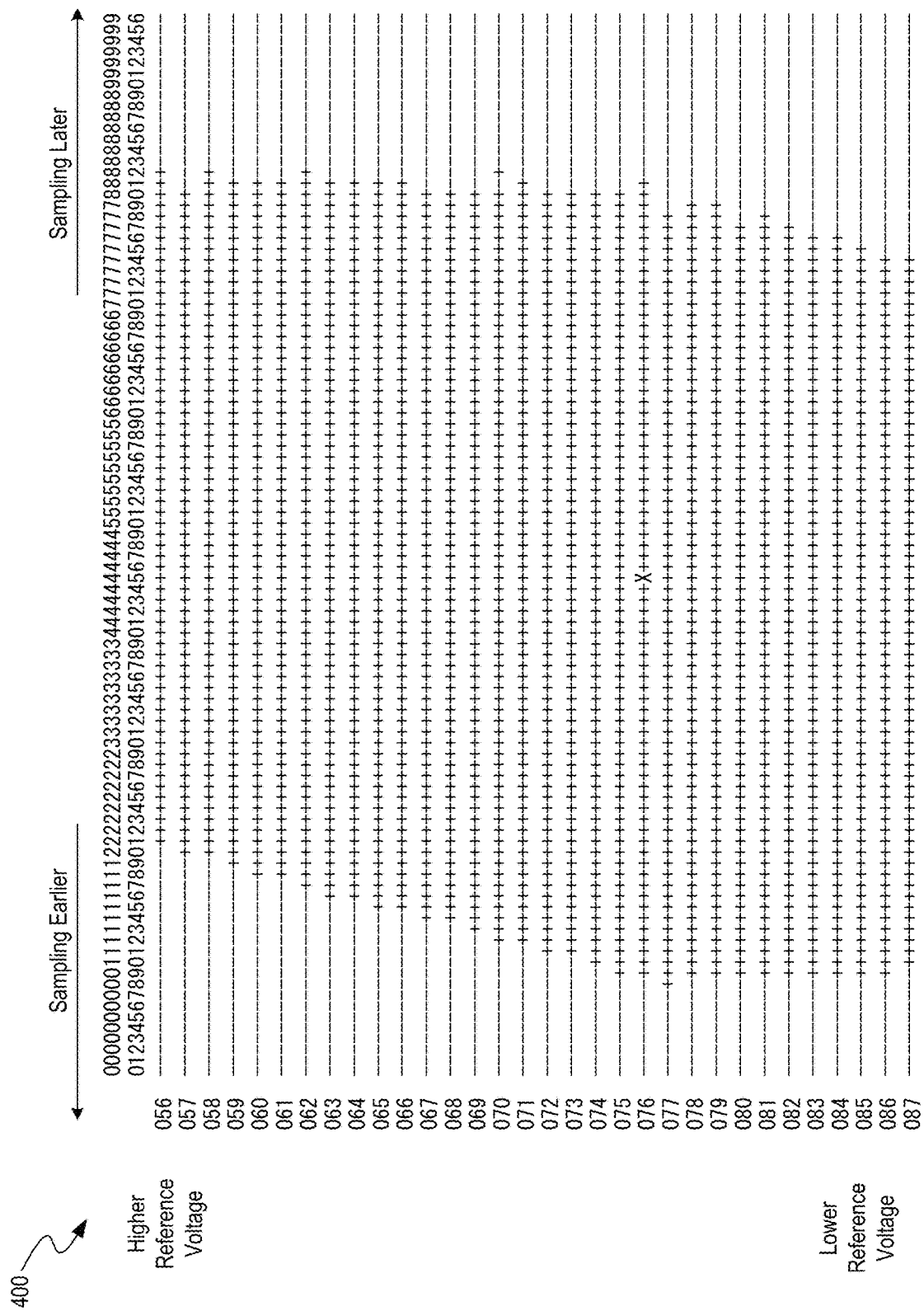
FIG. 4 is an example diagram illustrating an on-die Shmoo Plot in accordance with an embodiment of the present technology.

FIG. 4 is an example diagram illustrating an on-die shmoo plot 400 in accordance with an embodiment of the present technology. The apparatus (e.g., the apparatus 100 of FIG. 1A) can generate the on-die shmoo plot 400 (e.g., serialized output) with the pass/fail results of the sampled data corresponding to the various combinations of reference voltage levels and sample timing.

For the on-die shmoo plot 400, the reference voltage levels can be plotted as the vertical component (e.g., 'y' axis) and the timing points can be plotted as the horizontal component (e.g., 'x' axis). Each "+" represents a detected signal (e.g., a pass result or a voltage level greater than the reference level) and each "−" represents an undetected signal (e.g., a fail result or a voltage level less than the reference level) of the sampled data.

The apparatus can provide or communicate the on-die shmoo plot 400 or a corresponding sequence of representations to the apparatus controller as a feedback or an indication of the signal quality. For example, the apparatus and/or the apparatus controller can communicate the results of the varied sampling delays and/or the varied reference level according to a predetermined sequence. Based on the sequence, the apparatus can communicate values (e.g., '1' for detected signal and '0' for undetected signal) that correspond to detection results for the represented sampling delay and/or reference level.

Once the detection status is analyzed, the center point (represented using 'x' in FIG. 4) between the earliest detection point and latest detection point can illustrate the ideal sample point. The time between the earliest or latest detected sample and the center point can provide the signal margin. The on-die shmoo plot 400 can be used to determine if the optimal sample timing settings and/or optimal reference voltage settings are being used. Additionally or alternatively, the on-die Shmoo Plot 400 can be used to quantify the margin a signal has available in order to build confidence in a signal integrity. The "+" and "−" symbols indicate whether the signal was above (+) or below (−) the reference voltage level at that sampling time. In a first example, a data point is not detected (e.g., fail result) due to the reference voltage being too high for the sampling offset. In a second example, a data point is detected (e.g., pass result) when the signal exceeds the reference voltage level for the sampling offset. In a third example, data points on a plot can illustrate detection results caused by the noise of the signal. The apparatus can test and measure the real-time communication conditions (e.g., effects of the PVT parameters) using the different sampling delays, references levels, or combinations thereof.

An apparatus (e.g., the apparatus 100 of FIG. 1A) can organize the detection/non-detection results (represented by "+" and "−" symbols) according to the voltage levels and the timing offset values as a representation of a plot (e.g., on-die shmoo plot 400 of FIG. 4). The organized results can be communicated to the apparatus controller for analysis. The apparatus controller and/or the apparatus can process the corresponding shmoo plot 400 or the representation thereof according to one or more predetermined processing schemes to determine or adjust the sampling times and/or the reference level for subsequent operations. For example, the apparatus controller and/or the apparatus can find the middle setting (e.g., represented by 'x' in FIG. 4) that maximizes the margins according to the detection results.

Figure 5:
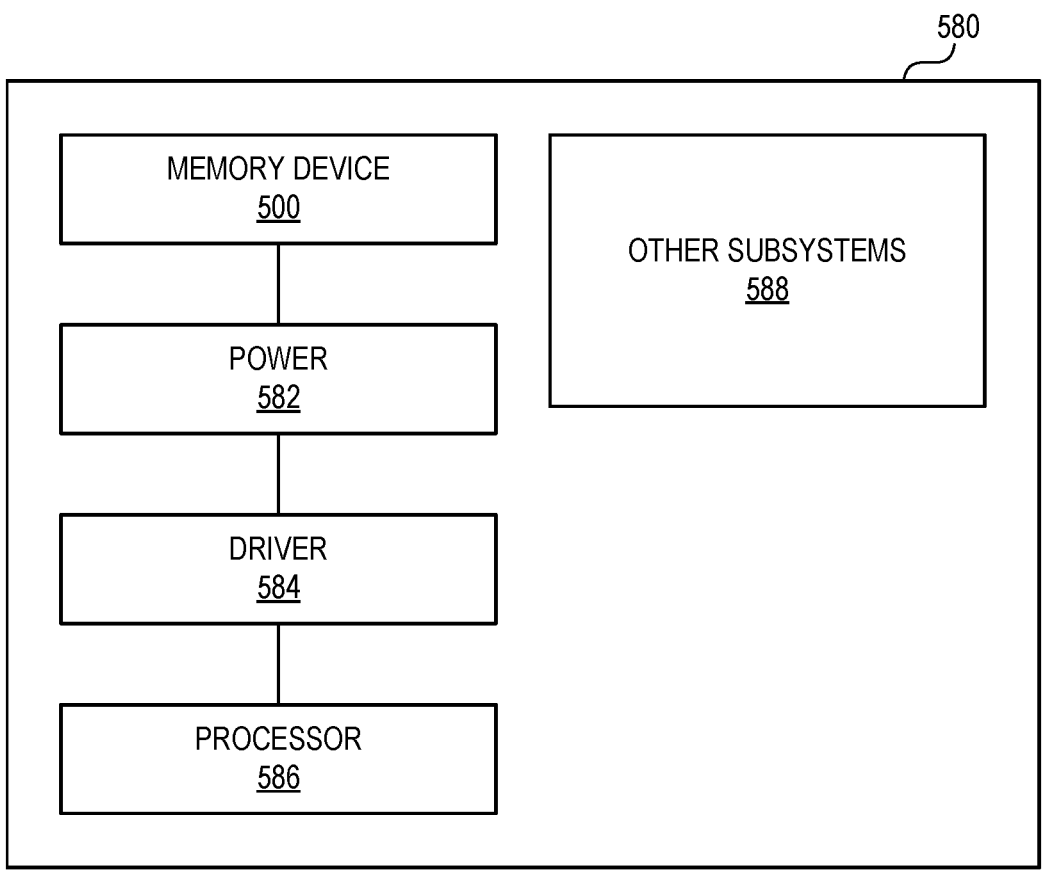
FIG. 5 is a schematic view of a system that includes an apparatus in accordance with an embodiment of the present technology.

FIG. 5 is a schematic view of a system that includes an apparatus in accordance with embodiments of the present technology. Any one of the foregoing apparatuses (e.g., memory devices) described above with reference to FIGS. 1-4 can be incorporated into any of a myriad of larger and/or more complex systems, a representative example of which is system 580 shown schematically in FIG. 5. The system 580 can include a memory device 500, a power source 582, a driver 584, a processor 586, and/or other subsystems or components 588. The memory device 500 can include features generally similar to those of the apparatus described above with reference to FIGS. 1-4, and can therefore include various features for performing a direct read request from a host device. The resulting system 580 can perform any of a wide variety of functions, such as memory storage, data processing, and/or other suitable functions. Accordingly, representative systems 580 can include, without limitation, hand-held devices (e.g., mobile phones, tablets, digital readers, and digital audio players), computers, vehicles, appliances and other products. Components of the system 580 may be housed in a single unit or distributed over multiple, interconnected units (e.g., through a communications network). The components of the system 580 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-5.

I claim:

1. An apparatus, comprising:
a communication circuit configured to communicate signals with an external controller, wherein the communicated signals include a predetermined data pattern from an external controller, wherein the predetermined data pattern includes at least a first portion and a second portion that are continuously communicated;
a logic circuit coupled to the communication circuit and configured to:
generate first sampling results based on sampling the first portion of the predetermined data pattern using (1) a first reference voltage level and/or (2) a first timing offset value relative to a period of a clock signal; and
generate second sampling results based on sampling the second portion of the predetermined data pattern using (1) a second reference voltage level and/or (2) a second timing offset value relative to the period of the clock signal, wherein
the communication circuit is configured to send the first sampling results and the second sampling results or a representation of the first and second sampling results to the external controller for adjusting a voltage setting and/or a timing associated with subsequently communicated signals.

2. The apparatus of claim 1, wherein the apparatus is further configured to:
adjust the first reference voltage level to the second reference voltage level;
generate third sampling results of the predetermined data pattern using the second reference voltage level and the first timing offset value relative to the clock signal; and
send the third sampling results to the external controller.

3. The apparatus of claim 1, wherein the apparatus is further (Original) configured to:
generate a serialized output representative of a plot that includes the first sampling results and the second sampling results arranged according to reference voltage levels and timing offset values; and
send the serialized output to the external controller.

4. The apparatus of claim 1, wherein the apparatus is further configured to:
determine one or more reference voltage levels and one or more timing offset values at which the predetermined data pattern has a sample output that matches a predetermined result.

5. The apparatus of claim 1, wherein the apparatus is further configured to:
determine one or more reference voltage levels and one or more timing offset values at which the predetermined data pattern does not have a sample output that matches a predetermined result.

6. The apparatus of claim 1, wherein the apparatus is further configured to:
determine a signal margin based on the first sampling results and the second sampling results.

7. The apparatus of claim 1, wherein the apparatus is a dynamic random-access memory (DRAM) that is coupled to the external controller.

8. A memory system, comprising:
a memory controller;
a memory array operably coupled to the memory controller and configured to:
receive a predetermined signal pattern from the memory controller, wherein the predetermined signal pattern includes at least a first portion and a second portion that are continuously communicated;
generate first sampling results based on sampling the first portion of the predetermined signal pattern using (1) a first reference voltage level and (2) a first timing offset value relative to a period of a clock signal;
generate second sampling results based on sampling the second portion of the predetermined signal pattern using (1) a second reference voltage level and (2) a second timing offset value relative to the period of the clock signal; and
send the first sampling results and the second sampling results to the memory controller,
wherein the memory controller and/or the memory array are/is configured to adjust a setting for communicating or processing subsequent signals according to the first and second sampling results.

9. The memory system of claim 8, wherein the memory array is further configured to:
adjust the first reference voltage level to the second reference voltage level;
generate third sampling results of the predetermined signal pattern using the second reference voltage level and the first timing offset value relative to the clock signal; and
send the third sampling results to the memory controller.

10. The memory system of claim 8, wherein the memory array is further configured to:
generate a serialized output representative of a plot that includes the first sampling results and the second sampling results arranged according to reference voltage levels and timing offset values; and
send the serialized output to the memory controller.

11. The memory system of claim 8, wherein the memory array is further configured to:
determine one or more reference voltage levels and one or more timing offset values at which the predetermined signal pattern has a sample output that matches a predetermined result.

12. The memory system of claim 8, wherein the memory array is further configured to:
determine one or more reference voltage levels and one or more timing offset values at which the predetermined signal pattern does not have a sample output that matches a predetermined result.

13. The memory system of claim 8, wherein the memory array is further configured to:
determine a signal margin based on the first sampling results and the second sampling results.

14. The memory system of claim 8, wherein the memory array is a dynamic random-access memory (DRAM).

15. A method of operating an apparatus, the method comprising:
generating first sampling results based on sampling a first portion of a predetermined data pattern using (1) a first reference voltage level and/or (2) a first timing offset value relative to a period of a clock signal, wherein the first portion of the predetermined data pattern is continuously communicated; and
generating second sampling results based on sampling a second portion of the predetermined data pattern using (1) a second reference voltage level and/or (2) a second timing offset value relative to the period of the clock signal, wherein the second portion of the predetermined data pattern is continuously communicated; and
sending the first sampling results and the second sampling results or a representation of the first and second sampling results to an external controller for adjusting a voltage setting and/or a timing associated with subsequently communicated signals.

16. The method of claim 15, further comprising:
adjusting the first reference voltage level to the second reference voltage level;
generating third sampling results of the predetermined data pattern using the second reference voltage level and the first timing offset value relative to the clock signal; and
sending the third sampling results to the external controller.

17. The method of claim 15, further comprising:
generating a serialized output representative of a plot that includes the first sampling results and the second sampling results arranged according to reference voltage levels and timing offset values; and
sending the serialized output to the external controller.

18. The method of claim 15, further comprising:
determining one or more reference voltage levels and one or more timing offset values at which the predetermined data pattern has a sample output that matches a predetermined result.

19. The method of claim 15, further comprising:
determining one or more reference voltage levels and one or more timing offset values at which the predetermined data pattern does not have a sample output that matches a predetermined result.

20. The method of claim 15, further comprising:
determining a signal margin based on the first sampling results and the second sampling results.

* * * * *